(12) United States Patent
Varjonen et al.

(10) Patent No.: US 12,308,518 B2
(45) Date of Patent: *May 20, 2025

(54) SLOT MODE ANTENNAS

(71) Applicant: Suunto Oy, Vantaa (FI)

(72) Inventors: Eero Varjonen, Vantaa (FI); Panu Perko, Vantaa (FI); Mikko Sepänniitty, Vantaa (FI); Erik Lindman, Vantaa (FI)

(73) Assignee: Suunto Oy, Vantaa (FI)

( * ) Notice: Subject to any disclaimer, the term of this patent is extended or adjusted under 35 U.S.C. 154(b) by 254 days.

This patent is subject to a terminal disclaimer.

(21) Appl. No.: 17/206,507

(22) Filed: Mar. 19, 2021

(65) Prior Publication Data

US 2021/0242598 A1    Aug. 5, 2021

Related U.S. Application Data

(63) Continuation of application No. 16/268,533, filed on Feb. 6, 2019, now Pat. No. 11,043,748.

(30) Foreign Application Priority Data

Feb. 8, 2018  (FI) ..................................... 20185115
Feb. 8, 2018  (GB) ..................................... 1802094

(51) Int. Cl.
*H01Q 13/10*       (2006.01)
*G01S 19/36*       (2010.01)
(Continued)

(52) U.S. Cl.
CPC ............ *H01Q 13/10* (2013.01); *G01S 19/36* (2013.01); *H01Q 1/273* (2013.01); *H01Q 1/42* (2013.01);
(Continued)

(58) Field of Classification Search
CPC .......... H01Q 13/10; H01Q 1/273; H01Q 1/42; H01Q 1/48; G01S 19/36; H04B 1/385; H05K 7/1427
See application file for complete search history.

(56) References Cited

U.S. PATENT DOCUMENTS 3,539,471 A   11/1970  Sproul
3,976,121 A   8/1976   Johnson
(Continued)

FOREIGN PATENT DOCUMENTS

AU          5186200 A        2/2001
CN          104051865 A      9/2014
(Continued)

OTHER PUBLICATIONS

Li: Design of Full Metal Boundary Smartphone Antennas. Master Thesis. University of Electronic Science and Technology of China, Submission Date: Mar. 31, 2015, pp. 1-61.

*Primary Examiner* — Wei (Victor) Y Chan
(74) *Attorney, Agent, or Firm* — Laine IP Oy

(57) ABSTRACT

The invention concerns an assembly for an antenna operating in a slot mode. It is also directed to an electronic wristwatch-like device comprising such antennas. The antenna assembly comprises at least one circuit board of an electronic device, a conductive body arranged at a distance from said at least one circuit board and defining a slot between them, at least one feed element for coupling an electromagnetic signal between said conductive body and said circuit board. A length of the slot is defined between two points at which said conductive body is connected to a ground plane of said at least one circuit board.

25 Claims, 6 Drawing Sheets

(51) Int. Cl.
  *H01Q 1/27*    (2006.01)
  *H01Q 1/42*    (2006.01)
  *H01Q 1/48*    (2006.01)
  *H04B 1/3827*   (2015.01)
  *H05K 7/14*    (2006.01)

(52) U.S. Cl.
  CPC .............. *H01Q 1/48* (2013.01); *H04B 1/385* (2013.01); *H05K 7/1427* (2013.01)

(56) References Cited

U.S. PATENT DOCUMENTS

| | | |
|---|---|---|
| 5,280,646 A | 1/1994 | Koyama et al. |
| 5,673,054 A | 9/1997 | Hama |
| 5,753,833 A | 5/1998 | Mitaki |
| 5,754,143 A | 5/1998 | Warnagiris et al. |
| 5,946,610 A | 8/1999 | Hama |
| 6,373,439 B1 | 4/2002 | Zurcher et al. |
| 6,519,548 B1 | 2/2003 | Kuroda et al. |
| 6,618,059 B1 | 9/2003 | Furuta |
| 6,762,678 B2 | 7/2004 | Arens |
| 6,853,605 B2 | 2/2005 | Fujisawa et al. |
| 6,885,201 B2 | 4/2005 | Germiquet et al. |
| 6,904,382 B2 | 6/2005 | Hayafune |
| 6,931,348 B2 | 8/2005 | Furuta et al. |
| 7,144,198 B2 | 12/2006 | Hirose et al. |
| 7,151,496 B2 | 12/2006 | Casagrande et al. |
| 7,201,539 B2 | 4/2007 | Schmets |
| 7,215,600 B1 | 5/2007 | Derosa |
| 7,271,774 B2 | 9/2007 | Puuri |
| 7,448,378 B2 | 11/2008 | Hirose |
| 7,600,430 B2 | 10/2009 | Palin et al. |
| 7,623,415 B2 | 11/2009 | Raeber et al. |
| 7,627,446 B2 | 12/2009 | Hirose |
| 7,698,091 B2 | 4/2010 | Claude |
| 7,869,308 B2 | 1/2011 | Rochat |
| 8,243,442 B2 | 8/2012 | Hobson et al. |
| 8,359,172 B2 | 1/2013 | Fattah |
| 8,467,272 B2 | 6/2013 | Fujisawa |
| 8,576,665 B2 | 11/2013 | Jiang et al. |
| 8,625,393 B2 | 1/2014 | Sonnenschein et al. |
| 8,988,226 B2 | 3/2015 | Vinano et al. |
| 9,123,483 B2 | 9/2015 | Ferri et al. |
| 9,369,214 B2 | 6/2016 | Fleming et al. |
| 9,450,297 B2 | 9/2016 | Sepänniitty et al. |
| 9,460,602 B2 | 10/2016 | Calhoun |
| 9,590,697 B2 | 3/2017 | Ide |
| 9,640,858 B1 | 5/2017 | Islam et al. |
| 9,647,338 B2 | 5/2017 | Nissinen et al. |
| 9,813,678 B2 | 11/2017 | Hollis |
| 9,818,284 B1 | 11/2017 | Wilder et al. |
| 10,019,885 B2 | 7/2018 | Miyake et al. |
| 10,079,428 B2 | 9/2018 | Nissinen et al. |
| 10,088,565 B2 | 10/2018 | Lee et al. |
| 10,262,524 B2 | 4/2019 | Guido |
| 10,271,299 B1 | 4/2019 | Sayem et al. |
| 10,401,167 B2 | 9/2019 | Huo et al. |
| 10,594,025 B2 | 3/2020 | Nissinen et al. |
| 10,664,020 B2 | 5/2020 | Yoshitani et al. |
| 10,780,960 B2 | 9/2020 | Castellanet |
| 2002/0008663 A1 | 1/2002 | Suguro et al. |
| 2004/0108861 A1 | 6/2004 | Germiquet et al. |
| 2004/0179433 A1 | 9/2004 | Paratte |
| 2005/0054321 A1 | 3/2005 | Casagrande et al. |
| 2005/0174294 A1 | 8/2005 | Peroulis et al. |
| 2005/0219955 A1 | 10/2005 | Xu et al. |
| 2005/0243486 A1 | 11/2005 | Wingfield et al. |
| 2006/0097918 A1 | 5/2006 | Oshiyama et al. |
| 2006/0227058 A1 | 10/2006 | Zellweger et al. |
| 2007/0146218 A1 | 6/2007 | Turner et al. |
| 2008/0150816 A1 | 6/2008 | Rahola et al. |
| 2008/0291591 A1 | 11/2008 | Huang et al. |
| 2009/0256758 A1 | 10/2009 | Schlub et al. |
| 2009/0312655 A1 | 12/2009 | Lo |
| 2009/0312656 A1 | 12/2009 | Lau et al. |
| 2010/0023095 A1 | 1/2010 | Stevenson et al. |
| 2010/0238080 A1 | 9/2010 | Lindberg et al. |
| 2011/0013491 A1 | 1/2011 | Fujisawa |
| 2011/0051561 A1 | 3/2011 | Fujisawa |
| 2011/0095622 A1 | 4/2011 | Feldstein et al. |
| 2011/0102274 A1 | 5/2011 | Fujisawa |
| 2011/0128200 A1 | 6/2011 | Hossain et al. |
| 2011/0148723 A1 | 6/2011 | Bengtsson et al. |
| 2011/0242747 A1 | 10/2011 | Hobson et al. |
| 2011/0316751 A1 | 12/2011 | Jarvis et al. |
| 2012/0105288 A1 | 5/2012 | Abe |
| 2012/0105888 A1 | 5/2012 | Nakayama |
| 2012/0120772 A1 | 5/2012 | Fujisawa |
| 2012/0146865 A1 | 6/2012 | Hayashi et al. |
| 2013/0181873 A1 | 7/2013 | Gutschenritter et al. |
| 2013/0210297 A1 | 8/2013 | Maas et al. |
| 2014/0085153 A1 | 3/2014 | Nagahama |
| 2014/0085154 A1 | 3/2014 | Nagahama |
| 2014/0139637 A1 | 5/2014 | Mistry et al. |
| 2014/0159989 A1 | 6/2014 | Malek et al. |
| 2014/0182148 A1 | 7/2014 | Heikkinen et al. |
| 2014/0225786 A1 | 8/2014 | Lyons et al. |
| 2014/0232603 A1 | 8/2014 | Fujisawa |
| 2014/0240181 A1 | 8/2014 | Mamuro et al. |
| 2014/0253150 A1 | 9/2014 | Menzel et al. |
| 2014/0253393 A1 | 9/2014 | Nissinen et al. |
| 2014/0253394 A1 | 9/2014 | Nissinen et al. |
| 2014/0266920 A1 | 9/2014 | Tran et al. |
| 2014/0266938 A1 | 9/2014 | Ouyang et al. |
| 2014/0306859 A1 | 10/2014 | Desclos et al. |
| 2014/0323063 A1 | 10/2014 | Xu et al. |
| 2014/0333494 A1 | 11/2014 | Huang |
| 2015/0048979 A1 | 2/2015 | Asrani et al. |
| 2015/0109172 A1 | 4/2015 | Iijima et al. |
| 2015/0188217 A1 | 7/2015 | Tsai et al. |
| 2015/0220066 A1 | 8/2015 | Fujisawa |
| 2015/0349410 A1 | 12/2015 | Russell et al. |
| 2016/0006109 A1 | 1/2016 | Apaydin et al. |
| 2016/0006110 A1 | 1/2016 | Jain et al. |
| 2016/0036120 A1 | 2/2016 | Sepänniitty et al. |
| 2016/0056533 A1 | 2/2016 | Nissinen et al. |
| 2016/0058375 A1 | 3/2016 | Rothkopf |
| 2016/0099497 A1 | 4/2016 | Lee |
| 2016/0254587 A1 | 9/2016 | Jung et al. |
| 2016/0308272 A1 | 10/2016 | Standke et al. |
| 2016/0344096 A1 | 11/2016 | Erentok |
| 2017/0062912 A1* | 3/2017 | Shewan .................. H01Q 1/44 |
| 2017/0179581 A1 | 6/2017 | Puuri et al. |
| 2017/0187096 A1 | 6/2017 | Hwang et al. |
| 2017/0214422 A1 | 7/2017 | Na et al. |
| 2018/0129168 A1 | 5/2018 | Chan |
| 2018/0287248 A1* | 10/2018 | Han ....................... H01Q 1/48 |
| 2018/0356861 A1 | 12/2018 | Ichikawa et al. |
| 2019/0058256 A1 | 2/2019 | Sepänniitty et al. |
| 2019/0072912 A1 | 3/2019 | Pandya et al. |
| 2019/0210703 A1 | 7/2019 | Sepänniitty et al. |
| 2019/0265655 A1* | 8/2019 | Naka ..................... H01Q 5/378 |

FOREIGN PATENT DOCUMENTS

| | | |
|---|---|---|
| CN | 204116829 U | 1/2015 |
| CN | 104466393 A | 3/2015 |
| CN | 104659493 A | 5/2015 |
| CN | 204424456 U | 6/2015 |
| CN | 104916915 A | 9/2015 |
| CN | 105093908 A | 11/2015 |
| CN | 105785757 A | 7/2016 |
| CN | 105870580 A | 8/2016 |
| CN | 205752546 U | 11/2016 |
| CN | 106299606 A | 1/2017 |
| CN | 106463824 A | 2/2017 |
| CN | 104638361 B | 3/2017 |
| CN | 106711584 A | 5/2017 |
| CN | 107077101 A | 8/2017 |
| CN | 107425292 A | 12/2017 |
| CN | 207379582 U | 5/2018 |
| CN | 108759977 A | 11/2018 |
| CN | 109425905 A | 3/2019 |
| CN | 110137669 A | 8/2019 |

(56) References Cited

FOREIGN PATENT DOCUMENTS

| | | | |
|---|---|---|---|
| EP | 0745915 | A2 | 12/1996 |
| EP | 0871238 | A2 | 10/1998 |
| EP | 1178374 | A2 | 2/2002 |
| EP | 1689023 | A1 | 8/2006 |
| EP | 1806276 | A2 | 7/2007 |
| EP | 2019448 | A1 | 1/2009 |
| EP | 2056395 | A1 | 5/2009 |
| EP | 2317602 | A1 | 5/2011 |
| EP | 3242357 | A1 | 11/2017 |
| FI | 20155124 | A | 9/2015 |
| GB | 2089075 | A | 6/1982 |
| GB | 2276274 | A | 9/1994 |
| GB | 2431522 | A | 4/2007 |
| JP | H04227301 | A | 8/1992 |
| JP | H08330826 | A | 12/1996 |
| JP | 2002261533 | A | 9/2002 |
| JP | 3611591 | B2 | 1/2005 |
| JP | 2009229368 | A1 | 10/2009 |
| WO | WO WO2004038856 | A1 | 5/2004 |
| WO | WO WO2011000438 | A1 | 1/2011 |
| WO | WO2016167914 | A1 | 10/2016 |
| WO | WO WO2017088164 | A1 | 6/2017 |
| WO | WO WO2018183678 | A1 | 10/2018 |
| WO | WO WO2019135856 | A1 | 7/2019 |

\* cited by examiner

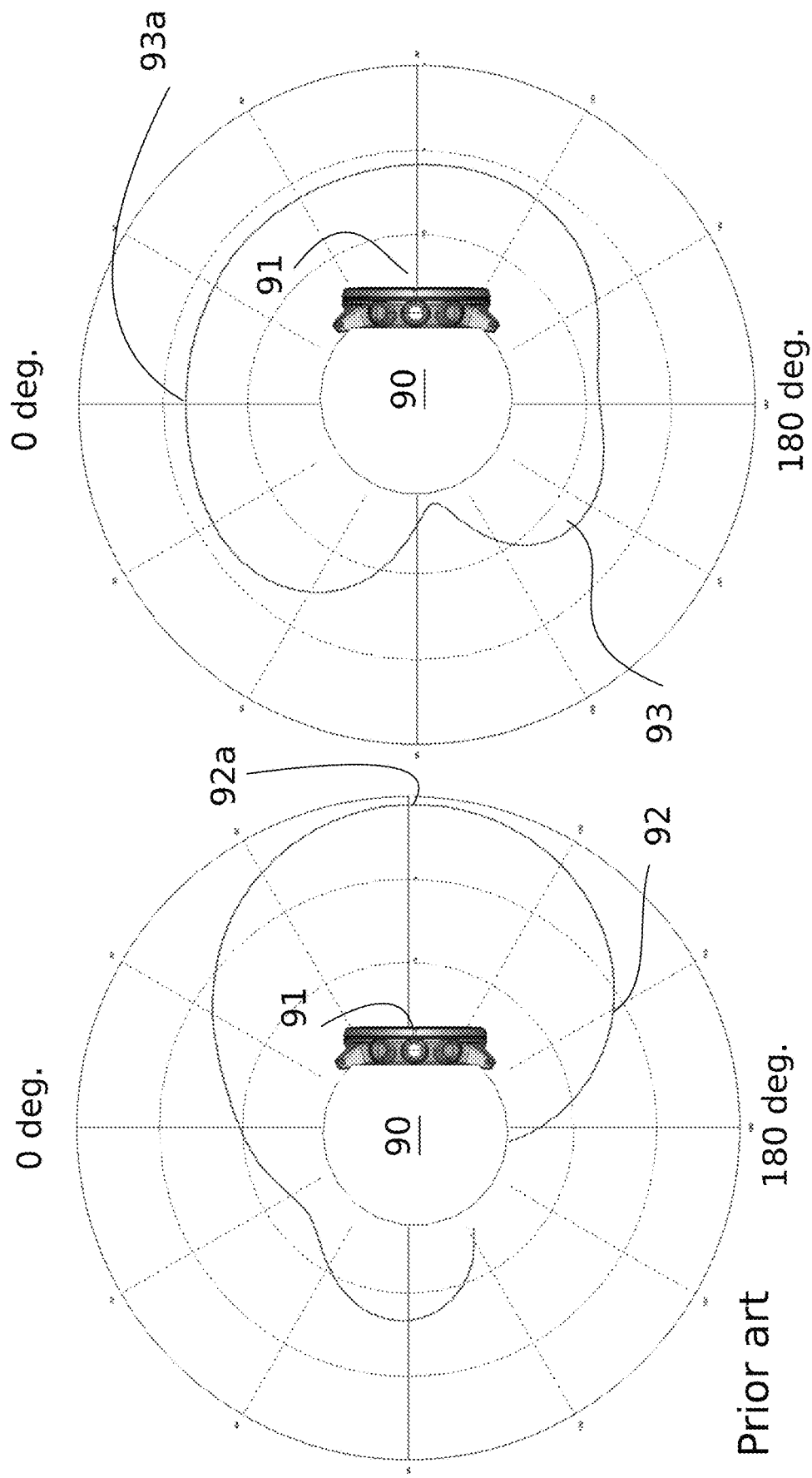

SLOT MODE ANTENNAS

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNOLOGICAL FIELD

The present disclosure relates generally to an antenna apparatus for use in electronic devices such as wireless or portable radio devices, and more particularly in apparatuses using slot antennas.

BACKGROUND OF THE INVENTION

Antennas are commonly found in most modern radio devices, such as mobile computers, portable navigation devices, mobile phones, smartphones, personal digital assistants (PDAs), wristwatches or other personal communication devices (PCD). Typically, these antennas comprise a planar radiating element with a ground plane that is generally parallel to the planar radiating element. The planar radiating element and the ground plane are typically connected to one another via a short-circuit conductor in order to achieve the desired impedance matching for the antenna. The structure is configured so that it functions as a resonator at the desired operating frequency. Typically, these internal antennas are located on a printed circuit board (PCB) of the radio device inside a plastic enclosure that permits propagation of radio frequency waves to and from the antenna(s).

More recently, it has been desirable for these radio devices to include a metal body or an external metallic surface. A metal body or an external metallic surface may be used for any number of reasons including, for example, providing aesthetic benefits such as producing a pleasing look and feel for the underlying radio device. However, the use of a metallic enclosure creates new challenges for radio frequency (RF) antenna implementations. Typical prior art antenna solutions, such as coupled antennas having radiator elements with a conductive ring-like structure, are not performing well in all cases e.g. due to inherent directivity in their radiation pattern. The fact that the metal housing and/or external metallic surface of the radio device acts as an RF shield which degrades antenna performance, particularly when the antenna is required to operate in several frequency bands, favors slot type antennas. Slot antennas are omnidirectional microwave antennas with linear polarization, and are used typically at frequencies between 300 MHz and 24 GHz.

Waveguide slot antennas usually have one or several longitudinal slots in the broad face of a standard rectangular waveguide, parallel to the length of the guide. A longitudinal slot cut into the wall of a waveguide interrupts the transverse current flowing in the wall, forcing the current to travel around the slot, which induces an electric field in the slot. The position of the slot in the waveguide determines the current flow. As the current in the walls of the guide are proportional to the difference in electric field between any two points, the position determines the impedance presented to the transmission line and the amount of energy coupled to the slot and radiated from the slot.

To make a slot antenna in a circular waveguide, such as one used in a watch-like GPS device or a wristop computer, an important design criteria is to locate the point of maximum electric field, which depends on the location of the slot along the periphery of the circular waveguide. In order to fix the alignment of the electric field in a circular waveguide, it must also be kept from rotating when encountering a discontinuity, such as a slot. The slot size, shape and the cavity behind are among the design variables that may be used to tune the performance.

In prior art solutions, antenna slots have been specially manufactured or created by dedicated parts and formations on the bezel and housing of wristwatch-like devices. In U.S. Pat. No. 7,271,774 is disclosed an example of an integral slot antenna formed in a conductive material portion of an outer housing of a wrist-wearable device.

Accordingly, there is a salient need for an antenna solution for use with a wearable or wrist worn radio device having an external metallic surface such as a bezel and a casing/body made of non-conductive material.

SUMMARY OF THE INVENTION

The inventors of the present disclosure have made the surprising observation that a slot antenna can be created by a bezel made of a conductive material, such as a metal, and the periphery of a circuit board itself. This offers significant advantages, as the position of the antenna structure, including but not limited to the slot and feed point, can be used to optimize the radiation pattern and therefore the reception of GNSS (Global Navigation Satellite System) signals for dedicated uses and sports, e.g. for running, walking or cycling. GNSS systems include, but are not limited to, GPS, Glonass, Galileo and Beidou navigation systems.

According to one aspect of the invention, an assembly for an antenna operating in a slot mode is provided, wherein the assembly comprises at least one circuit board of an electronic device, a conductive body arranged at a distance from said at least one printed circuit board and defining a slot mode antenna between them, said antenna having two end connecting points at which said conductive body is connected to a ground plane of said at least one circuit board and between said connection points at the edge of one of said at least one printed circuit board at least one feed element for coupling an electromagnetic signal between said conductive body and said circuit board. The effective width and/or length of the slot mode antenna is at least partially defined by a conductive rim structure running at least in part along the perimeter of said one printed circuit board and aligned against the edge of said board.

According to some embodiments of the invention, the circuit board is arranged in a plane parallel to and at least partly aligned with said conductive body, and has at least along a part of its periphery a conductive layer at said ground plane.

According to some embodiments of the invention, the assembly comprises an element having a connection point that connects said conductive body to a ground plane of said circuit board, said connection point being located at a first end of said slot forming said slot mode antenna. Correspondingly, the assembly may comprise the same or a different element, that has a connection point that connects said conductive body to a ground plane of said circuit board, said connection point being located at a second end of said slot forming said slot mode antenna. The element for said first and second connection points may be different, and be located at the first and second ends of said slot to thereby define the slot.

According to some embodiments of the invention, the conductive body is a bezel being a part of the housing encompassing a wristwatch-like device. The conductive body or bezel may have the shape of a ring, an ellipse, a rectangle, a square, or any other polygon.

According to some embodiments of the invention, the first and second connection points and at least one feed element in said wristwatch-like device is positioned approximately between 3 and 9 o'clock, preferably between 5 and 9 o'clock along the periphery of the device.

According to some embodiments of the invention, the assembly may comprise more than two connecting points. The circuit board and said conductive body may be arranged to define multiple slots between them. Each slot may then being defined between two connecting points and each slot may have a feed element between said connecting points, for example.

According to some embodiments of the invention, the conductive rim structure is at least in part forming an extension of the periphery of said one printed circuit board.

According to some embodiments of the invention, at least one slot in the assembly is adapted for the reception of a GNSS (Global Navigation Satellite System) signal. The GNSS signal may be a GPS, Glonass, Galileo and/or a Beidou signal, for example.

According to a second aspect of the invention, an electronic wristwatch-like device is provided, that comprise a housing, at least one printed circuit board inside said housing, a conductive bezel arranged at a distance from said printed circuit board as part of said housing and defining a slot between them, wherein the slot comprises an antenna operating in a slot mode having two end connecting points at which said bezel is connected to a ground plane of said at least one printed circuit board, and between said connection points at the edge of one of said at least one printed circuit board at least one feed element for coupling an electromagnetic signal between said bezel and said circuit board. The wristwatch-like device further comprises a conductive rim structure running at least in part along the perimeter of said one printed circuit board and aligned against the edge of said board, with which the effective width and/or length of the slot mode antenna at least partially is defined.

The inventive antenna assembly and wristwatch device is characterized by what is set forth in the appended claims. Further features of the present disclosure, its nature and various advantages will be more apparent from the accompanying drawings and the following detailed description.

BRIEF DESCRIPTION OF THE DRAWINGS

The features, objectives and advantages of the present disclosure will become more apparent from the detailed description set forth below, when taken in conjunction with the drawings, wherein:

FIGS. 9A and 9B show the RHCP radiation patterns of a prior art and an inventive antenna.

DETAILED DESCRIPTION OF EMBODIMENTS

Figure 1:
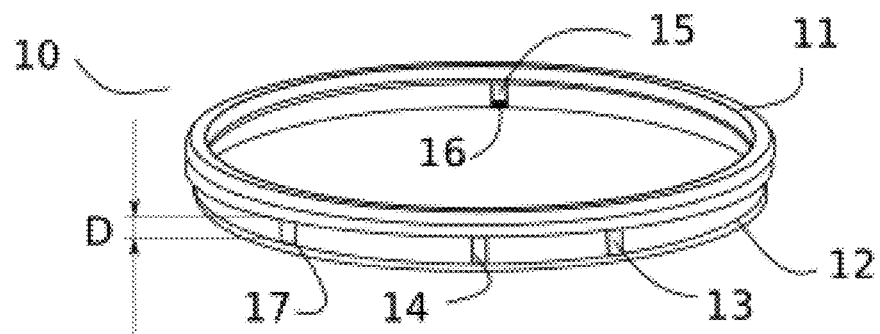
FIG. 1 is presenting an assembly for an antenna operating in a slot mode in accordance with at least some embodiments of the present invention.

In FIG. 1 is shown an inventive assembly 10 for an antenna operating in a slot mode. The exemplary assembly comprises a circuit board (PCB) 12 for a device, such as sports watch or smart watch, and a body, such as a ring-formed bezel 11, made of a conductive material and arranged on top of and in parallel to the PCB 12. The gap having a distance D between them defines a slot that enables the assembly 10 to act as an antenna in a slot mode. The periphery of the PCB 12 is at least partly aligned with the outer shape of the bezel 11, and has at least along a part of the periphery is a metallic layer (see FIG. 3, item 33) connected to the ground level of the PCB 12.

Obviously, the bezel may take the shape of a ring, an ellipse, a square, a rectangle, or any other polygon, for example. The shape of the PCB need then to be designed accordingly.

The exemplary assembly in FIG. 1 further comprises a feed element or pin 13 for coupling an electromagnetic signal between the slot mode antenna and the PCB 12. In the embodiment shown in FIG. 1, the feed element 13 is coupled between the bezel 11 and the PCB 12. The element 13 may be implemented in a variety of ways, as a pin or pogo stick, simply as a jumper connection, or as a stud on the PCB making contact with the slot mode antenna structure at the edge of the PCB, possibly with a via conducting the signal further in a multilayer PCB, for example. Any of this variety of solutions may be used in any embodiment of the present invention, as required by design, manufacturing and signal gain considerations.

Pins 14 and 15 are end connection points for grounding the conductive body 11 to a ground level on the circuit board. The distance between the end connection points 14 and 15 defines the length of the slot and the physical length of the slot mode antenna. The pins may be a simple jumper wire, or a spring loaded contact (pogo) pin, for example. The feed pins are preferably attached to the outer edge of the PCB, bezel or other structure to which is intended to make an electrical connection with, to facilitate easy tuning. Also other attachment points than the edges are possible, but may require more tuning of other related components.

According to some embodiments, pins 14 and 15 are to be considered as the physical representation of the end connection points that connect the conductive body 11 to a ground plane of the PCB 12. The pins may in some embodiments be integral parts of an insulating element (not shown) that is located between the PCB and the conductive body, as a support or otherwise. In some embodiments however, the elements containing the pins may be separate and located at the first and second ends of said slot to thereby define the physical length of the slot antenna.

The assembly may in some embodiments have floating or insulated support pins (not shown) or an insulating ring that maintain the gap between the bezel 11 and PCB 12. Alternatively, or in addition, the pin 15 may be connected to ground via a frequency selective circuit (e.g. a low-pass filter) or an electronic switch 16. Thereby the same feed pin 13 may be configured to feed the same slot assembly with two different slot lengths, a shorter between pins 14 and 15 and a longer between pin 14 and 17. Such an arrangement would make the antenna slot selectable or switchable and thus suitable for two different frequencies, as the electrical length of the slot seen by the feed point 13 is determined by pin 14 (counterclockwise) to pin 15 on one hand or by pin 14 to pin 17 on the other hand.

Figure 2:
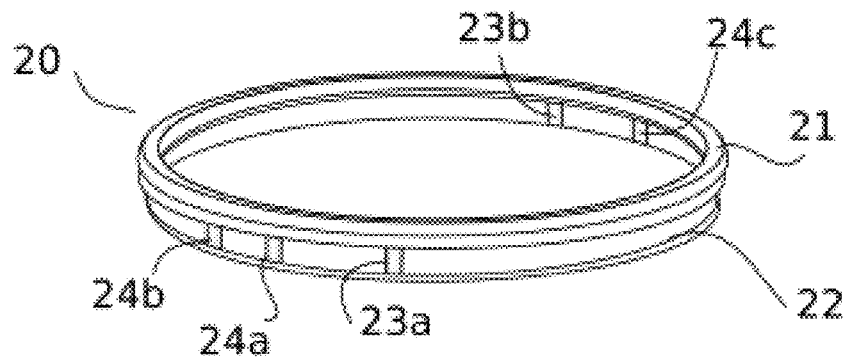
FIG. 2 is presenting an assembly for an antenna operating in a slot mode in accordance with at least some further embodiments of the present invention.

Turning now to FIG. 2, a similar assembly 20 is shown as in FIG. 1, but provided with two sections of the bezel 21 coupled separately to the PCB 22, thus providing two antennas operating in the slot mode. The length of a first slot mode antenna is defined by the section (counterclockwise) between the connection points or pins 24a-24c of the bezel 21, and the length of a second slot mode antenna is defined by the section between pins 24c-24b, correspondingly. Thus, a first slot mode antenna has grounding pins 24a and 24c. The feed element or pin 23a is located between the grounding pins, as shown.

A second slot mode antenna has a grounding pin 24b and a feed pin 23b located close to its second grounding pin 24c, as shown.

With different lengths of the bezel sections assigned to different antennas, they become tunable to different operating frequencies, and the electronic device they are connected to will thus be able to operate as a multi-band device.

A ground plane on a printed circuit board (PCB) is a large area or layer of copper foil connected to the circuit's ground point, usually one terminal of the power supply. It serves as the return path for current from many different components. A ground plane is often made as large as possible, covering most of the area of the PCB which is not occupied by circuit traces.

Figure 3:
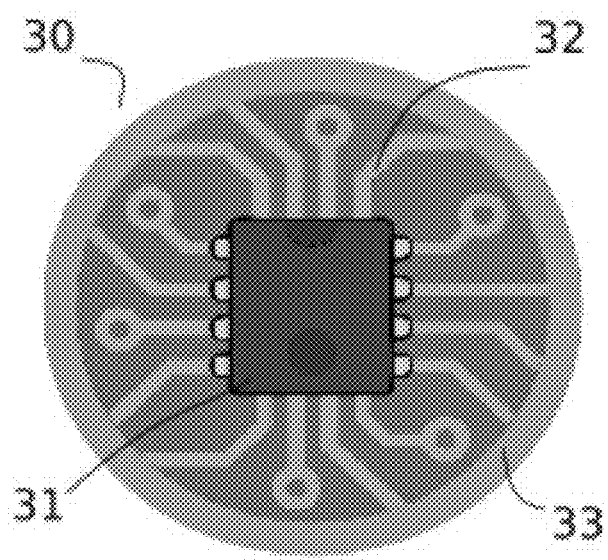
FIG. 3 is presenting a circular PCB mode in accordance with at least some embodiments of the present invention.

A large area of copper also conducts the large return currents from many components without significant voltage drops, ensuring that the ground connection of all the components are at the same reference potential. In digital and radio frequency PCBs, a reason for using large ground planes is to reduce electrical noise and interference through ground loops and to prevent crosstalk between adjacent circuit traces. In FIG. 3 is shown, for illustrative purposes, a typical circular PCB 30, with a microcontroller or -processor 31 and some copper wiring 32. According to an exemplary embodiment of the invention, the ground plane may be arranged as a copper brim 33 around the periphery of a circle-shaped PCB 30. This ensures the operation of an inventive slot-mode antenna as shown in FIGS. 1 and 2.

The processor 31 may comprise, for example, a single- or multi-core processor wherein a single-core processor comprises one processing core and a multi-core processor comprises more than one processing core. A processing core may comprise, for example, a Cortex-A8 processing core manufactured by ARM Holdings or a Steamroller processing core produced by Advanced Micro Devices Corporation. The processor 31 may comprise at least one Qualcomm Snapdragon and/or Intel Atom processor. Processor 31 may comprise at least one application-specific integrated circuit, ASIC. Processor 31 may comprise at least one field-programmable gate array, FPGA. Processor 31 may be means for performing method steps in the PCB 30.

Figure 4:
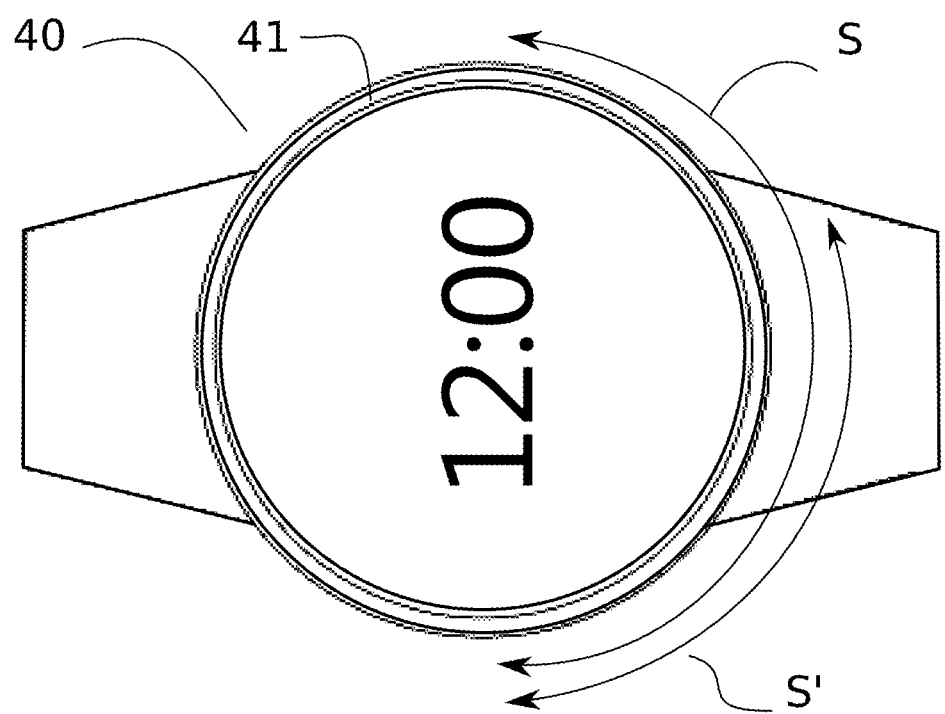
FIG. 4 shows an electronic wristwatch-like device mode in accordance with at least some embodiments of the present invention.

In FIG. 4 is schematically shown an electronic wristwatch-like device 40 from above. A metallic bezel 41 encompasses the housing. Normally, during running and worn on the wrist, the device has a slot antenna running along the edge of the device, that is positioned mainly on a semi-circle sector having an arc length S between 3 and 9 o'clock. The radiation pattern of the antenna is then pointing upwards towards the sky, i.e. a satellite constellation.

The angular width (here used as a synonym to a central angle from the midpoint of a circle) of the slot antenna depends on the diameter of the device and on the materials used, where parameters such as the permittivity of dielectric materials affect the result. The angular width may be larger or narrower than the suggested 180°, resulting in FIG. 4 in the arc length S between 3 and 9 o'clock. S may be written as $$S = \frac{\alpha}{180}\pi R,$$

where S is the arc length, $\alpha$ is the central angle (in degrees) of a circle sector having the arc length S, and R is the radius of the same circle, here a circle-shaped slot antenna. The smaller the diameter of the device, the larger the angular width a should be in order to yield a specific arc length S.

In FIG. 4 is also indicated a narrower sector S', of some 120° between 5 and 9 o'clock, approximately. The inventors have found, in contrary to prior art solutions where feed pins are usually placed in the center of the slot antenna, that the polarization characteristics of the inventive antenna assembly is working optimally, for devices carried on the wrist and when walking and/or running, if the feed pin (see FIGS. 1 and 2) between the PCB and the bezel is located in a sector which is at a distance no further than a quarter to a third of the total slot antenna length, counted from the start of the antenna. The starting point is here at the 9 o'clock position. With the positioning of the feed pin, an optimal impedance match for the antenna at the GPS resonant frequency is sought. Less tuning of other components may then be necessary in order to achieve optimum reception of the GPS or other satellite systems signals.

Generally, the feed pin or a feed connection point can be on either the bezel side of the slot or on the PCB edge side of the slot. PCB placement may be favored by its mechanical simplicity and can be chosen if good enough antenna performance is achievable.

The RHCP (Right Hand Circular Polarization) component of the radiation pattern seem then to have a desired dominant peak that is pointing upwards, when the device is carried on the wrist (usually the left wrist). The achievable optimum radiation pattern is partly dependent on the device, i.e. the size of the device and the impedance of the slot antenna, and partly on the incoming signal direction and polarization. The latter requires that the slot antenna and its radiation field should be facing at least partly upwards in the mainly used GNSS reception use position.

It is according to the invention possible to at least partially alter the effective width and/or length of the slot by conductive rim structures deposited on or attached to the ground plane of the circuit board, and facing said conductive body. Such rim structures may comprise sheet metal parts etc. One example is shown in FIG. 5, with an assembly 50 that consists of a bezel ring 51, a first semi-circular PCB board 52 and a copper brim 54 arranged around the periphery of the PCB 52 as a ground plane, and a second semi-circular PCB board 53 arranged beneath the first PCB board 52.

Attached to the second (lowermost) PCB board 53 is a sheet metal rim 55, which width (i.e. its height in relation to PCB 52) and length may be chosen to make it form part of a GPS slot antenna, together with the PCB 52 and the bezel 51. Slot defining members 56 and 57, which may serve as grounding pins defining the ends of the slot antenna, are shown between the sheet metal rim 55 and the bezel 51. A pin-like feed element 58 is also shown. The feed elements may take a multitude of shapes and be implemented in a variety of ways, as discussed above.

Figure 5:
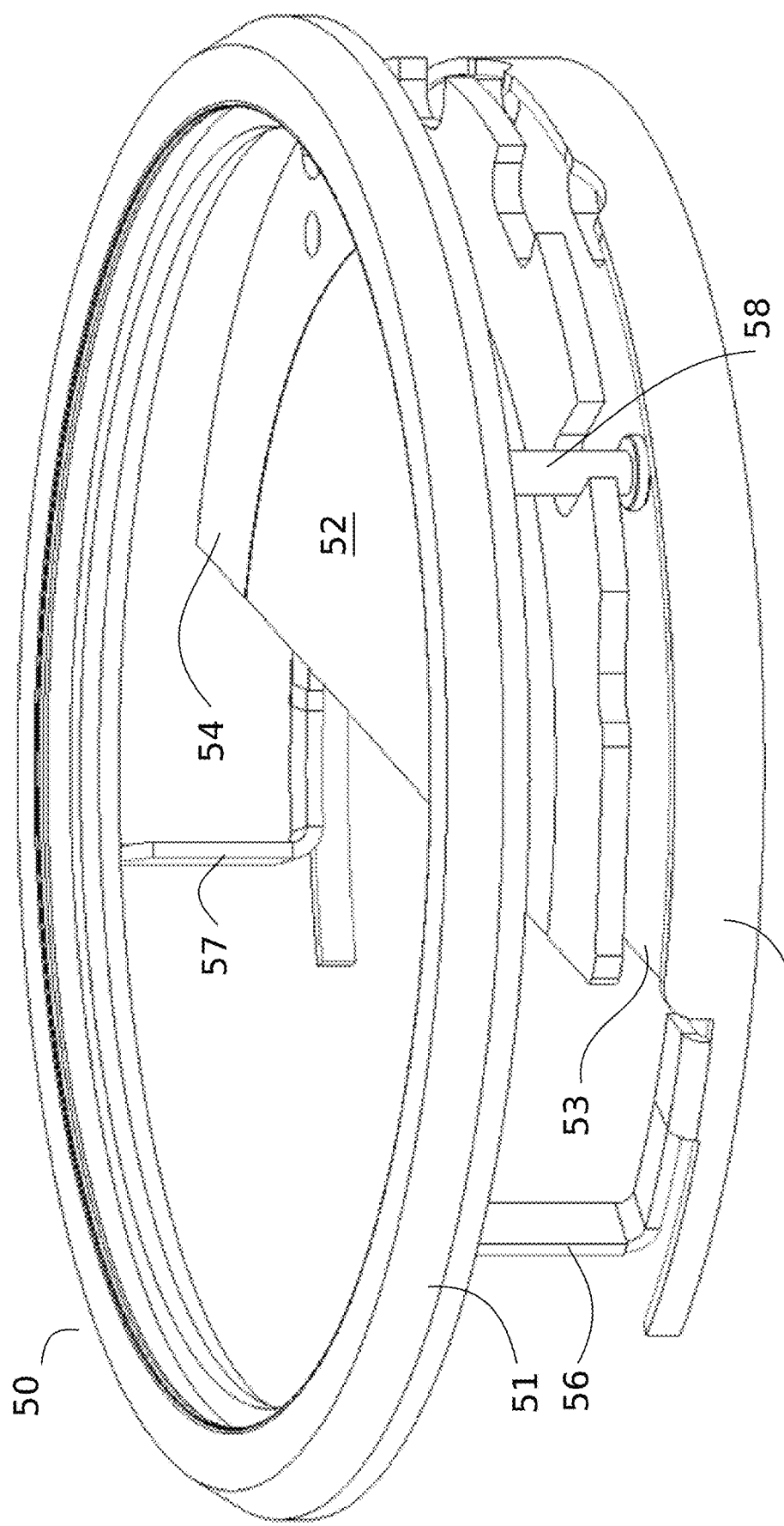
FIG. 5 shows an assembly for an antenna operating in a slot mode in accordance with still some further embodiments of the present invention.
Figure 6:
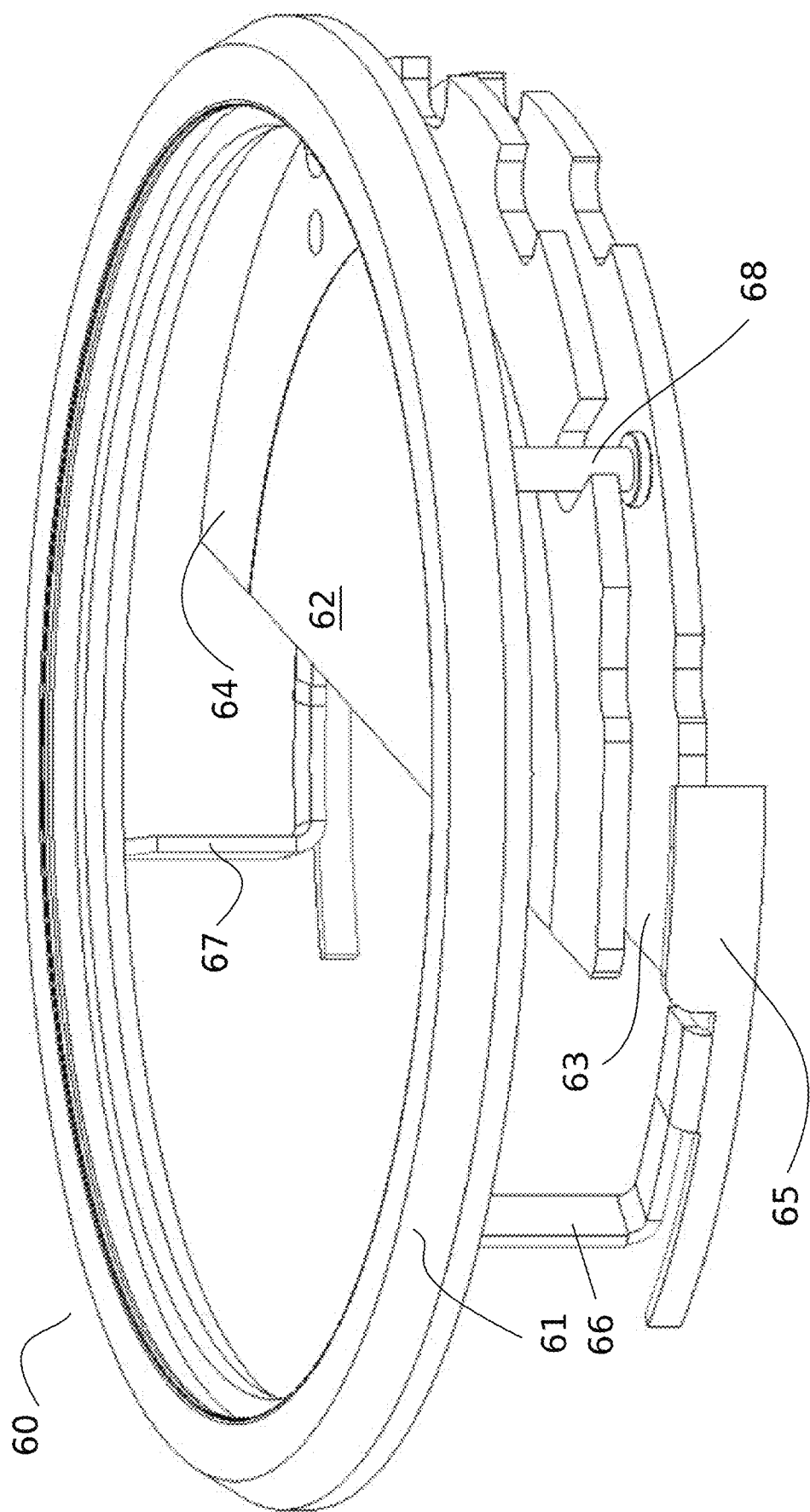
FIG. 6 shows an assembly for an antenna operating in a slot mode in accordance with a variant of FIG. 5 as a further embodiment of the present invention.

FIG. 6 is a similar assembly to the one in FIG. 5, with parts 60-68 corresponding to parts 50-58 in FIG. 5. In FIG. 6, however, the metal sheet rim 65 is formed at least partly as an extension of a second lowermost PCB board 63. The rim extensions 65 may be connected to the copper brim 64 of the PCB 62 and/or to a copper brim (not shown) of the PCB 63. Again, the width (i.e. the height in relation to PCB 62) and length of the rim 65 may be chosen to make it form part of a GPS slot antenna, together with the PCB 62 and the bezel 61.

Figure 7:
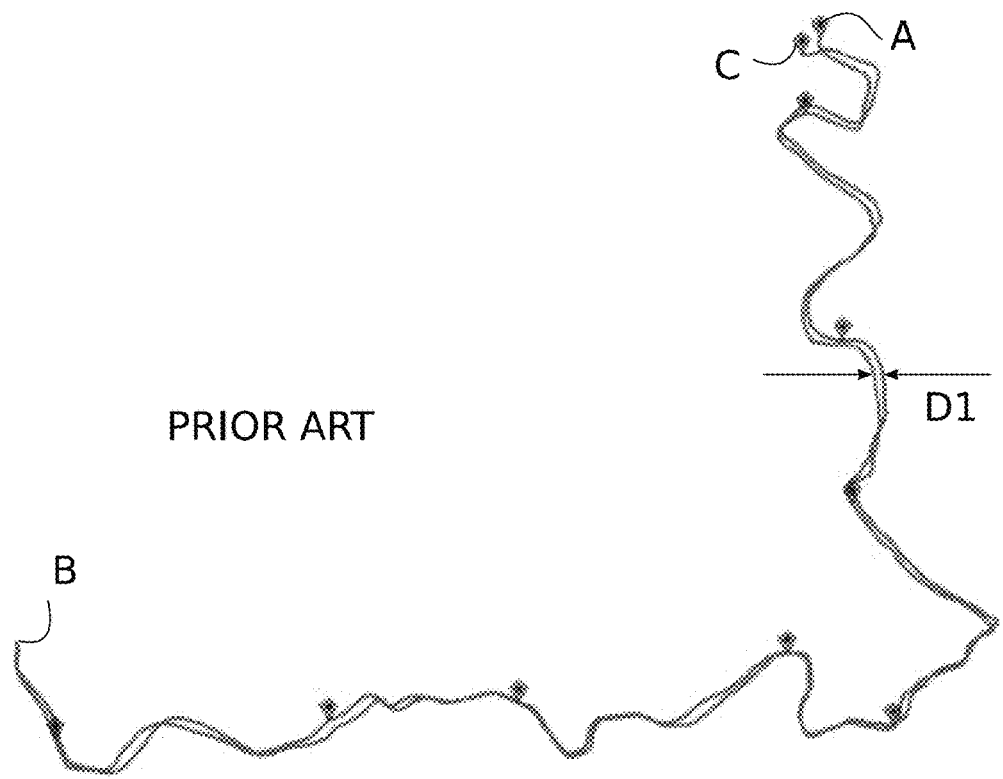
FIG. 7 shows the accuracy of a prior art GPS antenna.
Figure 8:
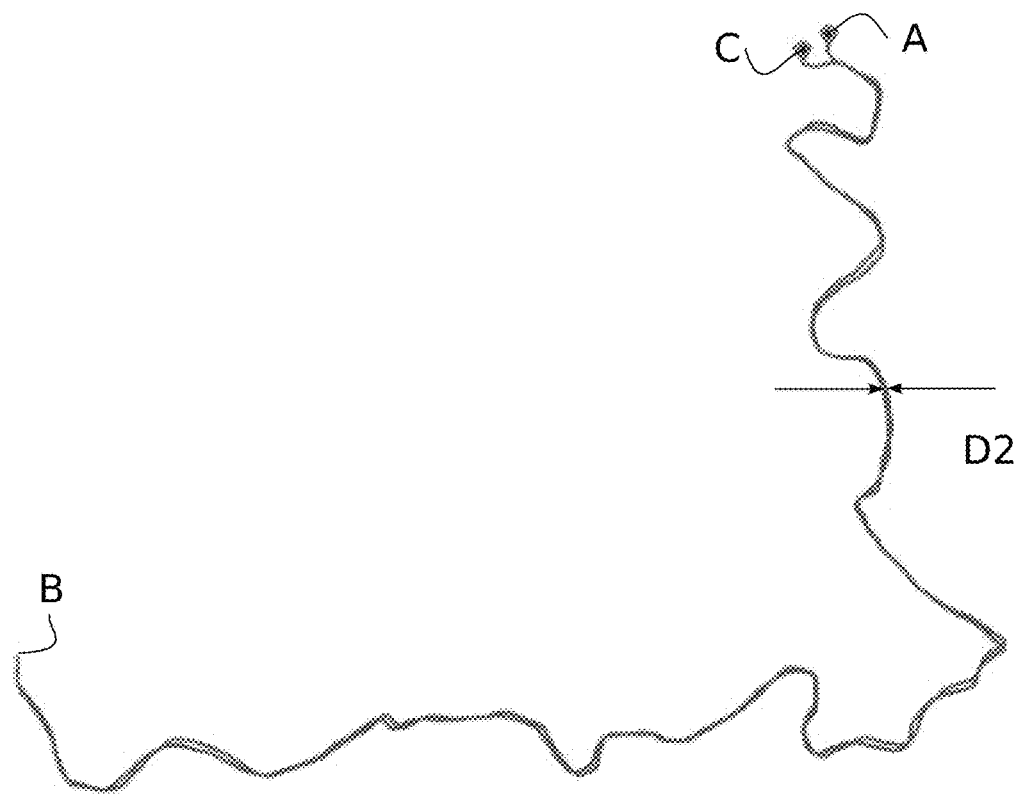
FIG. 8 shows the corresponding accuracy of an inventive slot mode GPS antenna.

In FIGS. 7 and 8 is shown the improved accuracy of the inventive slot mode antenna compared with antennas of prior art. In FIG. 7, a terrain round-trip route A-B-C was run by a person while the run was tracked by wristwatch-like GPS device having a prior art coupled radiator GPS antenna such as is known form e.g. US2017/0179581. A typical deviation at D1 between the different legs of the trip can be seen at many places along the route. In FIG. 8, where a device with similar performance, but using an inventive slot mode antenna, the deviation D2 is much smaller along the legs of the route A-B-C.

In FIGS. 9A and 9B are shown the corresponding RHCP (Right Hand Circular Polarization) radiation patterns in 2 dimensions (2D). A typical wristwatch-like GPS device 91 is carried on the wrist 90 of the left hand shown in a circular cross-section in both FIGS. 9A and 9B. A typical prior art antenna radiation pattern 92, using a conventional bezel antenna with radiating elements, for example, is shown in FIG. 9A. The peak 92a of the radiation pattern 92 is pointed in a lateral direction, and is less optimal in receiving an incoming satellite signal in the use position shown. The peak 93a of the radiation pattern 93 is pointing upwards, and is thus having a strong radiation field in the 0 degree direction when the device is in its most often used position.

It may be noted from FIGS. 9A and 9B that the slot antenna on FIG. 9B performs well also in a situation where the person wears the watch on the inside of the wrist. In this case the watch is turned upside down compared to FIG. 9B, but the slot antenna radiation pattern (shown here in the 180 degree direction) then pointing in the 0 degree direction will still be wider than the corresponding 0 degree direction pattern of the prior art bezel antenna in FIG. 9A.

It will be recognized that while certain aspects of the present disclosure are described in terms of a specific sequence of steps of a method, these descriptions are only illustrative of the broader methods of the disclosure, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the disclosure disclosed and claimed herein.

While the above detailed description has shown, described, and pointed out novel features of the antenna apparatus as applied to various embodiments, it will be understood that various omissions, substitutions, and changes in the form and details of the device or process illustrated may be made by those skilled in the art without departing from the fundamental principles of the antenna apparatus. The foregoing description is of the best mode presently contemplated of carrying out the present disclosure. This description is in no way meant to be limiting, but rather should be taken as illustrative of the general principles of the present disclosure. The scope of the present disclosure should be determined with reference to the claims.

The invention claimed is:

1. An assembly for an antenna operating in a slot mode, wherein the assembly comprises
   at least one printed circuit board of an electronic wristwatch-like device,
   a conductive body arranged at a distance from said at least one printed circuit board and defining a slot mode antenna between them, wherein the conductive body is a bezel being a part of a housing encompassing the electronic wristwatch-like device,
   said antenna having two end connection points at which said bezel is connected to a ground plane of said at least one circuit board, and between said connection points at the edge of one of said at least one printed circuit board is at least one feed element for coupling an electromagnetic signal between said slot mode antenna and said circuit board, and
   wherein the effective width and/or length of the slot mode antenna is at least partially defined by a conductive rim structure running at least in part along the perimeter of said one printed circuit board and attached to the edge of said board.

2. The assembly according to claim 1, wherein said circuit board is arranged in a plane parallel to and at least partly aligned with said bezel, and wherein said circuit board has at least along a part of the periphery of the board a conductive layer at said ground plane.

3. The assembly according to claim 1, further comprising an element having a connection point that connects said bezel to a ground plane of said circuit board, said connection point being located at a first end of said slot forming said slot mode antenna.

4. The assembly according to claim 1, further comprising an element having a connection point that connects said bezel to a ground plane of said circuit board, said connection point being located at a second end of said slot forming said slot mode antenna.

5. The assembly according to claim 1, wherein said element for said first and second connection points are separate and located at the first and second ends of said slot which defines the length of the slot mode antenna.

6. The assembly according to claim 1, wherein said first and second connection points and at least one feed element in said wristwatch-like device is positioned approximately between 3 and 9 o'clock along the periphery of the device.

7. The assembly according to claim 1, wherein said bezel has the shape of a ring, an ellipse, a rectangle, a square, or any other polygon.

8. The assembly according to claim 1, further comprising more than two connecting points.

9. The assembly according to claim 8, wherein said circuit board and said bezel are arranged to define multiple slots between them, each slot being defined between two connecting points and each slot having at least one feed element between said connecting points.

10. The assembly according to claim 1, wherein said conductive rim structure is at least in part forming an extension of the periphery of said one printed circuit board.

11. The assembly according to claim 1, wherein at least one slot in the assembly is adapted for the reception of a GNSS (Global Navigation Satellite System) signal.

12. The assembly according to claim 11, wherein said GNSS signal is selected from GPS, Glonass, Galileo and/or Beidou signals.

13. An electronic wristwatch-like device comprising
a housing,
at least one printed circuit board inside said housing,
a conductive bezel arranged at a distance from said printed circuit board as part of said housing and defining a slot between them,
wherein the slot comprises an antenna operating in a slot mode having two end connecting points at which said bezel is connected to a ground plane of said at least one printed circuit board, and between said connection points at the edge of one of said at least one printed circuit board at least one feed element for coupling an electromagnetic signal between said slot mode antenna and said circuit board, and
wherein said wristwatch-like device further comprises a conductive rim structure running at least in part along the perimeter of said one printed circuit board and attached to the edge of said board, with which the effective width and/or length of the slot mode antenna at least partially is defined,
wherein said circuit board is arranged in a plane parallel to and at least partly aligned with said conductive bezel.

14. The device according to claim 13, wherein said circuit board has at least along a part of the periphery of said circuit board a conductive layer at said ground plane.

15. The device according to claim 13, further comprising an element having a connection point that connects said conductive body to a ground plane of said circuit board, said connection point being located at a first end of said slot forming said slot mode antenna.

16. The device according to claim 13, further comprising an element having a connection point that connects said conductive body to a ground plane of said circuit board, said connection point being located at a second end of said slot forming said slot mode antenna.

17. The device according to claim 13, wherein said element for said first and second connection points are separate and located at the first and second ends of said slot which defines the length of the slot mode antenna.

18. The device according to claim 13, wherein said first and second connection points and said at least one feed element are positioned approximately between 3 and 9 o'clock along the periphery of the device.

19. The device according to claim 13, wherein said conductive bezel has the shape of a ring, an ellipse, a rectangle, a square, or any other polygon.

20. The device according to claim 13, wherein said slot mode antenna comprises more than two connecting points.

21. The device according to claim 13, wherein said circuit board and said conductive bezel are arranged to define multiple slots between them, each slot being defined between two connecting points and each slot having at least one feed element between said connecting points.

22. The device according to claim 13, wherein said conductive rim structure is at least in part forming an extension of the periphery of said one printed circuit board.

23. The device according to claim 13, wherein at least one slot in the device is adapted for the reception of a GNSS (Global Navigation Satellite System) signal.

24. The device according to claim 23, wherein said GNSS signal is selected from GPS, Glonass, Galileo and/or Beidou signals.

25. The assembly according to claim 1, wherein the at least one feed element is directly connected to the at least one circuit board.

* * * * *